(12) United States Patent
Uetsuji et al.

(10) Patent No.: US 9,455,550 B2
(45) Date of Patent: Sep. 27, 2016

(54) DISTRIBUTED FEEDBACK LASER DIODE

(71) Applicant: Mitsubishi Electric Corporation, Tokyo (JP)

(72) Inventors: Tetsuya Uetsuji, Tokyo (JP); Kazushige Kawasaki, Tokyo (JP); Masafumi Minami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 14 days.

(21) Appl. No.: 14/718,340

(22) Filed: May 21, 2015

(65) Prior Publication Data
US 2015/0255957 A1 Sep. 10, 2015

Related U.S. Application Data

(62) Division of application No. 14/530,881, filed on Nov. 3, 2014, now abandoned.

(30) Foreign Application Priority Data

Jan. 23, 2014 (JP) ................................. 2014-010350

(51) Int. Cl.
*H01S 5/12* (2006.01)
*H01S 5/323* (2006.01)
*H01S 5/32* (2006.01)

(52) U.S. Cl.
CPC ............. *H01S 5/323* (2013.01); *H01S 5/1231* (2013.01); *H01S 5/3211* (2013.01); *H01S 5/1225* (2013.01)

(58) Field of Classification Search
CPC .......................................... H01S 5/12–5/1246
See application file for complete search history.

(56) References Cited

U.S. PATENT DOCUMENTS

| | | | |
|---|---|---|---|
| 4,375,686 A | 3/1983 | De Waard |
| 4,837,775 A | 6/1989 | Andrews et al. |
| 5,105,431 A | 4/1992 | Tanaka |
| 5,182,758 A | 1/1993 | Taneya et al. |
| 5,357,538 A | 10/1994 | Talneau et al. |
| 5,394,429 A | 2/1995 | Yamada et al. |
| 5,659,562 A | 8/1997 | Hisa |
| 5,739,890 A | 4/1998 | Uda et al. |
| 6,064,685 A | 5/2000 | Bissessur et al. |
| 6,495,384 B1 | 12/2002 | Morimoto et al. |
| 6,567,446 B1 | 5/2003 | Huang et al. |

(Continued)

FOREIGN PATENT DOCUMENTS

| | | |
|---|---|---|
| EP | 0 632 298 A2 | 1/1995 |
| JP | 8-248425 A | 9/1996 |

(Continued)

OTHER PUBLICATIONS

Taiwan Patent Office; Office Action in Taiwanese Patent Application No. 103136966 (Sep. 2, 2015).

(Continued)

*Primary Examiner* — Joshua King
(74) *Attorney, Agent, or Firm* — Leydig, Voit & Mayer, Ltd.

(57) ABSTRACT

A distributed feedback laser diode includes a substrate, an active layer located above and supported by the substrate, and a diffraction grating diffracting light generated in the active layer. The diffraction grating includes features and each feature includes dots. Each of the dots has a length less than 2.5 μm.

4 Claims, 4 Drawing Sheets

(56) References Cited

U.S. PATENT DOCUMENTS

| | | | |
|---|---|---|---|
| 6,577,660 B1 | 6/2003 | Muroya | |
| 7,151,789 B2 | 12/2006 | Jetté et al. | |
| 7,936,513 B2* | 5/2011 | Wu | G02B 6/124 359/569 |
| 2004/0042516 A1* | 3/2004 | Takaki | H01S 5/12 372/50.11 |
| 2005/0276302 A1 | 12/2005 | Okunuki | |
| 2009/0009868 A1 | 1/2009 | Wu et al. | |
| 2011/0304265 A1* | 12/2011 | Ikegami | B82Y 30/00 313/504 |
| 2012/0286258 A1* | 11/2012 | Naraoka | C09K 11/06 257/40 |

FOREIGN PATENT DOCUMENTS

| | | |
|---|---|---|
| JP | 2000-138413 A | 5/2000 |
| JP | 2004-31402 A | 1/2004 |
| JP | 2004-128372 A | 4/2004 |
| JP | 2005-243412 A | 9/2005 |
| JP | 2005-353761 A | 12/2005 |
| JP | 2008-205278 A | 9/2008 |
| TW | 200903465 A | 1/2009 |

OTHER PUBLICATIONS

Korean Patent Office; Office Action in Korean Patent Application No. 10-2015-0003981 (Mar. 31, 2016).

* cited by examiner

DISTRIBUTED FEEDBACK LASER DIODE

BACKGROUND OF THE INVENTION

1. Field of the Invention

The present invention relates to a distributed feedback laser diode including a diffraction grating formed by electron beam lithography and a method of fabricating the distributed feedback laser diode.

2. Background Art

Japanese Patent Laid-Open No. 2005-353761 discloses a distributed feedback laser diode including a diffraction grating having a sawtooth profile at the interface between an InGaAsP light guiding layer and a p-type InP cladding layer.

There are cases where diffraction grating features are drawn on a resist by electron beam lithography and then a diffraction grating is formed using the diffraction grating features. Electron beam lithography enables the drawing of fine diffraction grating features, but has the problem that processing time increases in proportion to the area of the diffraction grating features.

SUMMARY OF THE INVENTION

The present invention has been made in order to solve the above-described problem, and an object of the present invention is to provide a distributed feedback laser diode and a distributed feedback laser diode fabrication method which can reduce the time required for electron beam lithography.

The features and advantages of the present invention may be summarized as follows.

According to one aspect of the present invention, a distributed feedback laser diode includes a substrate, an active layer formed above the substrate, and a diffraction grating having a first feature and a second feature and being configured to diffract light generated in the active layer, the second feature being shorter than the first feature and facing a central portion of the first feature.

According to another aspect of the present invention, a distributed feedback laser diode includes a substrate, an active layer formed above the substrate, and a diffraction grating having a plurality of features and being configured to diffract light generated in the active layer, wherein each of the plurality of features is formed by a series of dots each having a length of not less than 2.5 µm.

According to another aspect of the present invention, a method of fabricating a distributed feedback laser diode, includes the steps of forming a diffraction grating layer above a substrate, forming a conductive layer above the diffraction grating layer, forming a resist on the conductive layer, applying an electron beam to the resist to draw a diffraction grating feature by electron beam lithography, and forming a diffraction grating by etching the diffraction grating layer to leave a portion of the diffraction grating layer, the portion of the diffraction grating layer being directly under the diffraction grating feature.

According to another aspect of the present invention, a method of fabricating a distributed feedback laser diode, includes the steps of forming a diffraction grating layer above a substrate, forming an insulating layer patterned into a strip on the diffraction grating layer, forming a resist on the insulating layer and the diffraction grating layer to make a portion of the resist on the insulating layer thinner than a portion of the resist on the diffraction grating layer, applying an electron beam to the resist on the insulating layer to draw a diffraction grating feature by electron beam lithography, and forming a diffraction grating by etching the diffraction grating layer to leave a portion of the diffraction grating layer, the portion of the diffraction grating layer being directly under the diffraction grating feature.

Other and further objects, features and advantages of the invention will appear more fully from the following description.

DETAILED DESCRIPTION OF THE PREFERRED EMBODIMENTS

Distributed feedback laser diodes and distributed feedback laser diode fabrication methods according to embodiments of the present invention will be described with reference to the drawings. The same or corresponding components will be denoted by the same reference signs, and the repetition of explanation thereof may be omitted.

Embodiment 1

Figure 1:
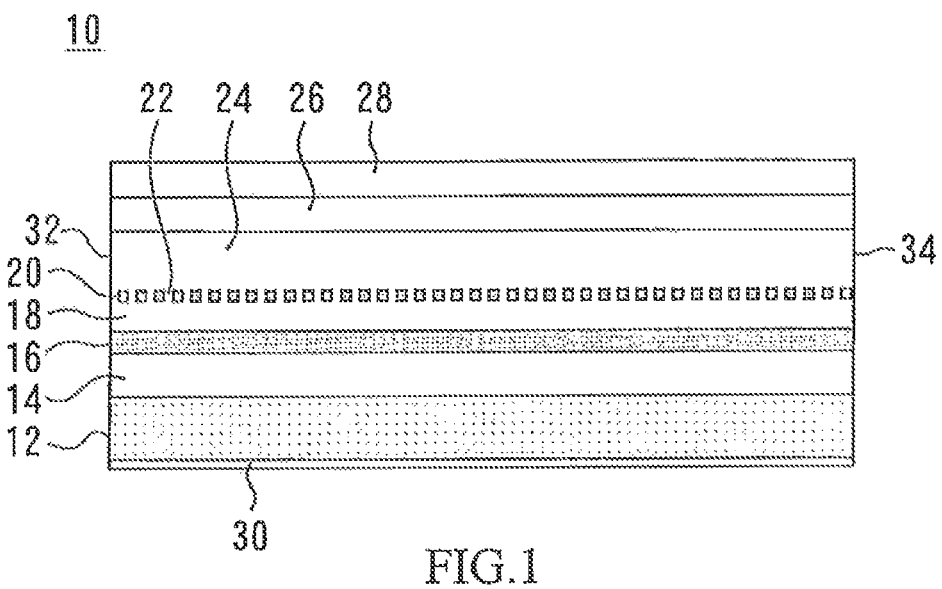
FIG. 1 is a sectional view of a distributed feedback laser diode according to an embodiment 1.

FIG. 1 is a sectional view of a distributed feedback laser diode 10 according to an embodiment 1 of the present invention. The distributed feedback laser diode 10 includes a substrate 12 made of, for example, p-type InP. On the substrate 12, a p-type cladding layer 14 is formed. On the p-type cladding layer 14, an active layer 16 is formed. On the active layer 16, an n-type spacer layer 18 is formed.

On the n-type spacer layer 18, a diffraction grating 20 made of, for example, InP is formed. Between a plurality of features constituting the diffraction grating 20, a light guiding layer 22 made of, for example, InGaAsP is formed. On the light guiding layer 22, an n-type cladding layer 24 made of, for example, InP is formed. Accordingly, the diffraction grating 20 is buried under the n-type cladding layer 24 and in the light guiding layer 22.

On the n-type cladding layer 24, an n-side electrode 28 is formed with a contact layer 26 interposed therebetween. Moreover, on a backside of the substrate 12, a p-side electrode 30 is formed. The distributed feedback laser diode 10 constitutes a resonator having end faces 32 and 34.

Figure 2:
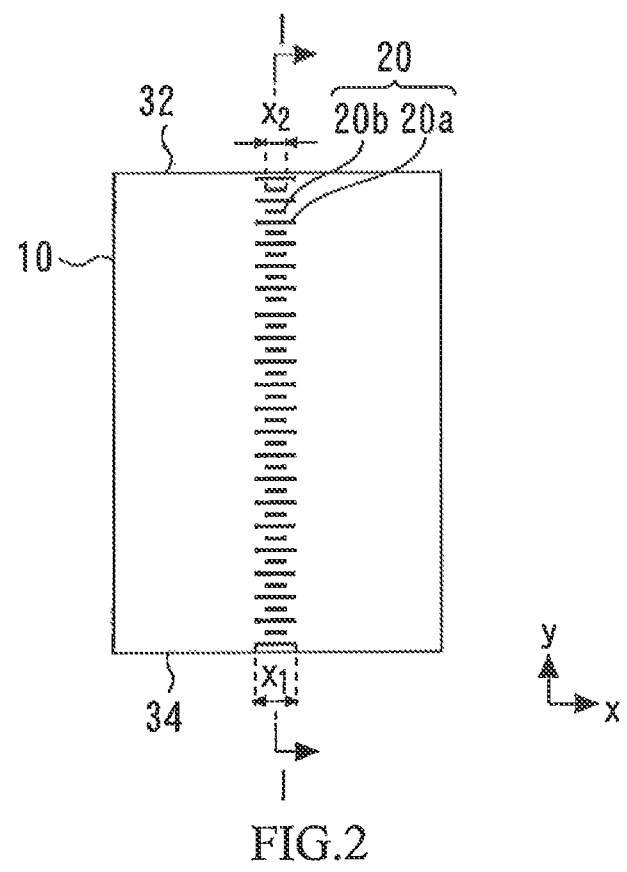
FIG. 2 is a plan view of the diffraction grating illustrated in FIG. 1.

FIG. 2 is a plan view of the diffraction grating 20 illustrated in FIG. 1. The diffraction grating 20 has a structure in which first features 20a and second features 20b shorter than the first features are alternately formed. The length (x1) of each first feature 20a is, for example, 10 µm. The length (x2) of each second feature 20b is, for example, 3 µm. The spacing between the first feature 20a and the second feature 20b is, for example, approximately 200 nm.

The second feature 20b faces a central portion of the first feature 20a. In other words, the second feature 20b does not face end portions of the first feature 20a. As a result, the diffraction grating 20 functions as a diffraction grating which includes a plurality of 3-µm-width features provided from the end face 32 to the end face 34 at regular intervals. Further, the diffraction grating 20 diffracts light generated in the active layer 16 to realize single-wavelength emission.

Next, a method of forming the diffraction grating 20 will be described. First, a diffraction grating layer for forming a diffraction grating is formed on an entire surface of a wafer. Then, a resist is formed on the diffraction grating layer. After that, electron beam lithography is performed on the resist to form diffraction grating features corresponding to features of the diffraction grating one by one. Subsequently, using the diffraction grating features as a mask, part of the diffraction grating layer is etched to form the diffraction grating 20.

It should be noted that even in the case where the widths of the features constituting the diffraction grating are 10 µm, only central portions having widths of 3 µm are actually used, and other portions having total widths of 7 µm are formed in order to cope with process variations. Accordingly, in the case where process variations can be controlled to a certain extent, the widths of the features constituting the diffraction grating may be shorter than 10 µm.

In the diffraction grating 20 according to the embodiment 1 of the present invention, since the second features 20b are shorter than the first features 20a, the time required for electron beam lithography can be reduced accordingly. Furthermore, since the first features 20a and the second features 20b form a diffraction grating which includes a plurality of 3-µm-width features provided from the end face 32 to the end face 34 at regular intervals, a diffraction grating can be provided which has a function equivalent to that of a diffraction grating formed only by first features.

Figure 3:
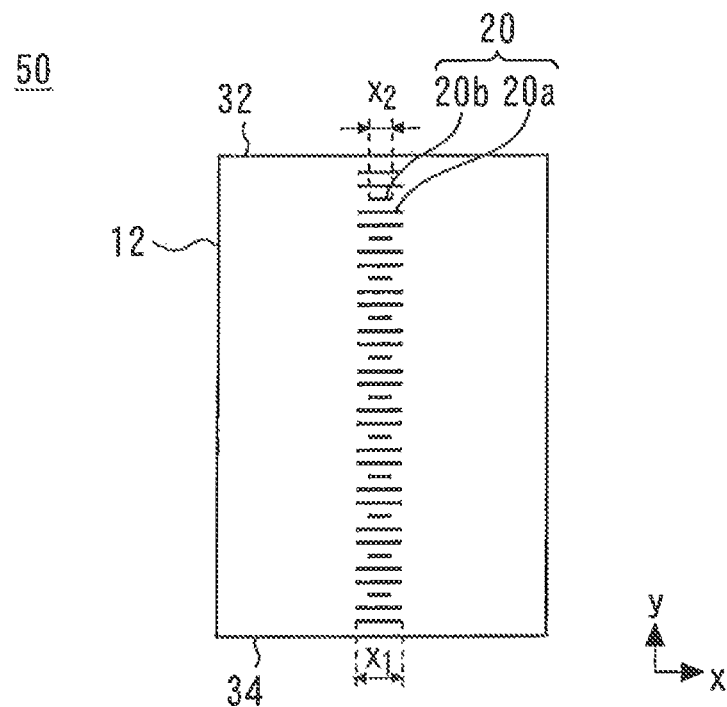
FIG. 3 is a plan view of a diffraction grating according to a modified example.
Figure 4:
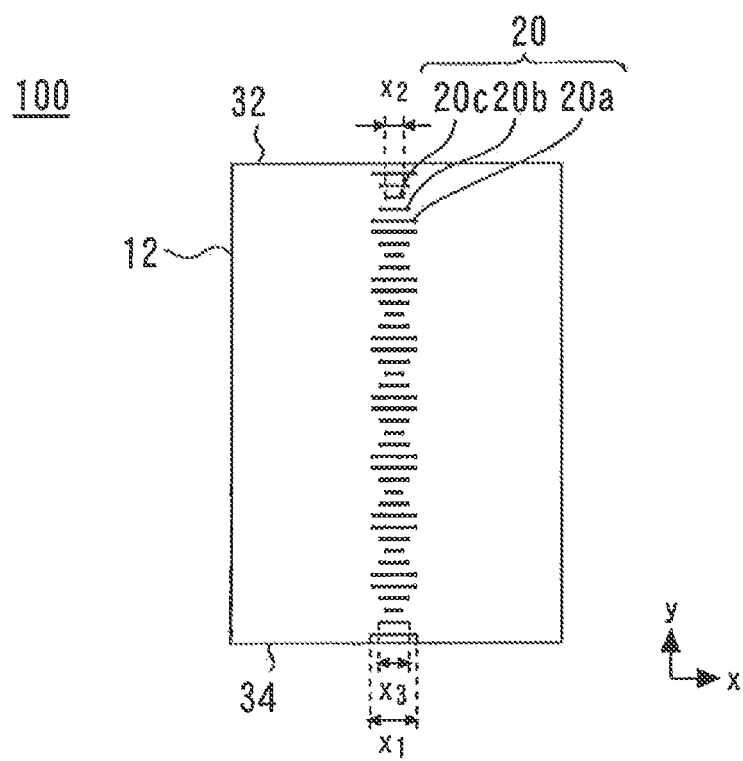
FIG. 4 is a plan view of a diffraction grating according to another modified example.

FIG. 3 is a plan view of a diffraction grating according to a modified example. In this diffraction grating of a distributed feedback laser diode 50, the density of second features 20b is low compared to that in the diffraction grating of the distributed feedback laser diode 10. FIG. 4 is a plan view of a diffraction grating according to another modified example. This diffraction grating of a distributed feedback laser diode 100 includes second features 20b and 20c. Both the second features 20b and 20c are shorter than the first features 20a, but the second features 20c are shorter than the second features 20b. As described with reference to FIGS. 2 and 3, the density of the second features may be changed, or second features having a plurality of different lengths may be provided.

The lengths of the first features 20a and the lengths of the second features 20b are not particularly limited, but preferably within the range of 3 µm to 10 µm so that the time required for electron beam lithography may not be long. Moreover, a phase shift portion may be formed in which the phase of the diffraction grating is intentionally shifted. It should be noted that these modifications can be applied to distributed feedback laser diodes and distributed feedback laser diode fabrication methods according to embodiments below.

Embodiment 2

Figure 5:
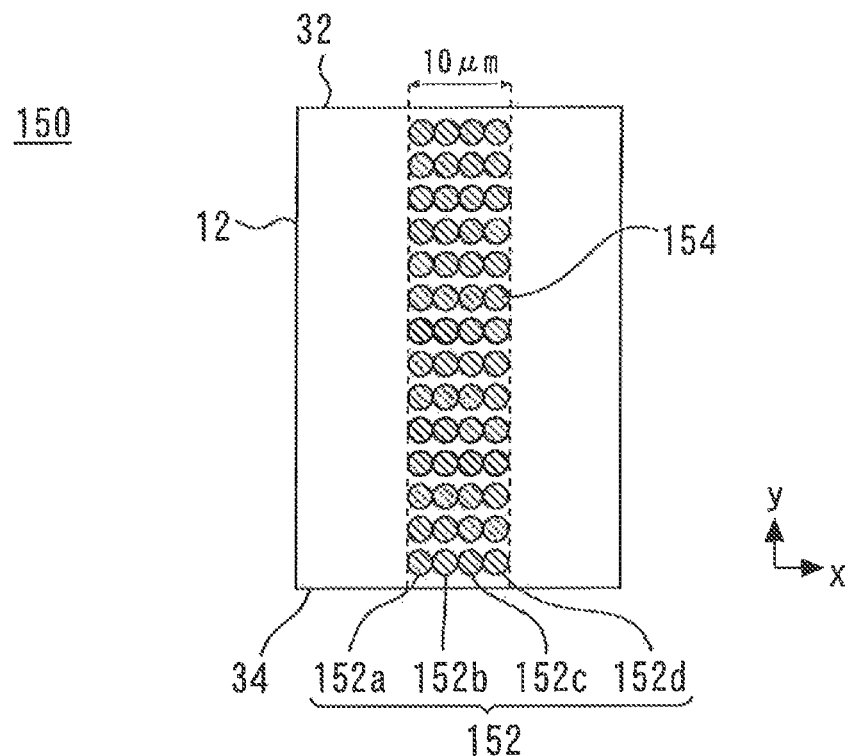
FIG. 5 is a plan view of a diffraction grating of a distributed feedback laser diode according to an embodiment 2.

FIG. 5 is a plan view of a diffraction grating of a distributed feedback laser diode 150 according to an embodiment 2 of the present invention. A plurality of features 152 formed parallel to the x direction constitute a diffraction grating 154. Each of the plurality of features 152 is formed by a series of 2.5-µm-length dots 152a, 152b, 152c, and 152d linearly arranged along the direction. As shown in FIG. 5, each dot contacts its neighboring dot or dots so that the dots 152a, 152b, 152c, and 152d are contiguous in forming the respective feature 152. It should be noted that the lengths of the dots are not particularly limited as long as the lengths of the dots are not less than 2.5 µm.

In electron beam lithography, there are cases where diffraction grating features are formed on a resist by scanning a wafer with respect to an electron beam irradiation apparatus which generates a pulsed electron beam. In such a case, each diffraction grating feature is formed by a series of a plurality of dots. For example, in the case where the diameters of the dots are several hundred nanometers, many dots are required to form a single feature having a length of 10 µm, and thus the time required for electron beam lithography becomes long.

However, in a distributed feedback laser diode fabrication method according to the embodiment 2 of the present invention, since each feature is formed by a series of dots having lengths of not less than 2.5 µm, each feature can be formed by a very small number of dots. Accordingly, the time required for electron beam lithography can be reduced by increasing the scanning speed of a wafer with respect to an electron beam irradiation apparatus.

Embodiment 3

Figure 6:
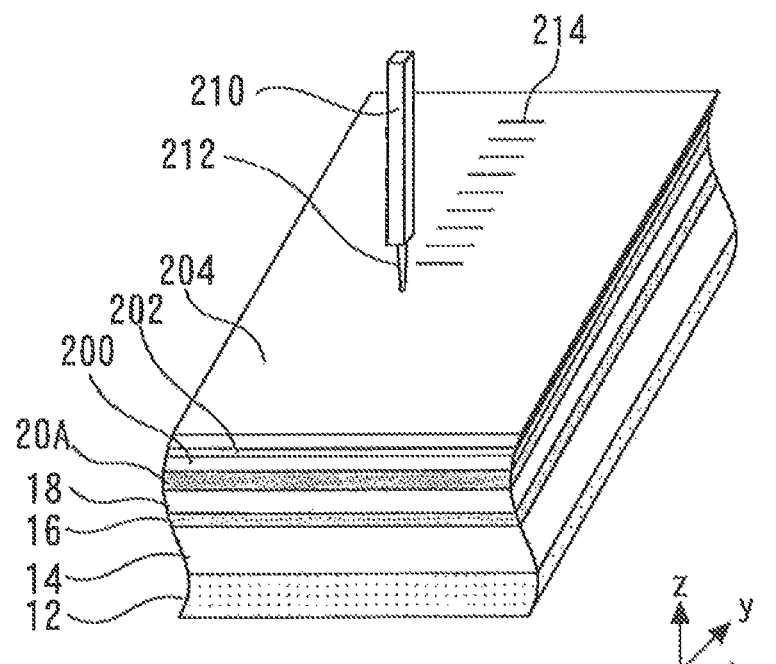
FIG. 6 is a partially sectional perspective view of a wafer for explaining a distributed feedback laser diode fabrication method according to an embodiment 3.

FIG. 6 is a partially sectional perspective view of a wafer for explaining a distributed feedback laser diode fabrication method according to an embodiment 3 of the present invention. In this fabrication method, first, a diffraction grating layer 20A is formed above the substrate 12. Then, on the diffraction grating layer 20A, an insulating layer 200 made of, for example, $SiO_2$ is formed. After that, on the insulating layer 200, a conductive layer 202 made of, for example, W (tungsten) is formed. The conductive layer 202 is formed above the diffraction grating layer 20A.

Subsequently, on the conductive layer 202, a resist 204 is formed. Then, an electron beam is applied to the resist 204 to draw diffraction grating features by electron beam lithography. Specifically, an electron beam 212 emitted from an electron beam irradiation apparatus 210 is applied to the resist 204 to form diffraction grating features 214 for forming a diffraction grating. FIG. 6 illustrates the diffraction grating features in the process of being formed.

Then, the conductive layer 202, the insulating layer 200, and the diffraction grating layer 20A are etched by, for example, dry etching to leave portions of the diffraction grating layer 20A which are directly under the diffraction grating features 214. Thus, a diffraction grating is formed. After the formation of the diffraction grating, the insulating layer 200 and the conductive layer 202 are removed. Alternatively, the diffraction grating layer 20A may be etched using the insulating layer 200 as a mask after features corresponding to the diffraction grating features 214 are formed in the insulating layer 200.

In the distributed feedback laser diode fabrication method according to the embodiment 3 of the present invention, since the conductive layer 202 is formed, the distributed feedback laser diode can be prevented from charging up (being charged) due to the irradiation of the resist 204 with an electron beam. Accordingly, the resolution can be improved by increasing the accelerating voltage and the beam current of the electron beam irradiation apparatus 210, and the time required for electron beam lithography can be reduced.

Moreover, since the conductive layer 202 functions as an electron beam reflecting film, the sensitivity of the resist can be increased compared to that in the case where the conductive layer 202 is not formed. Accordingly, the time required for electron beam lithography can be reduced by increasing the speed of electron beam lithography.

The insulating layer 200 is provided in order to protect the diffraction grating layer 20A from the conductive layer 202. Accordingly, in the case where the diffraction grating layer 20A is not damaged, the insulating layer 200 may be omitted. Moreover, the material forming the conductive layer 202 is not limited to W, but may be any material which can prevent charging-up and increase the sensitivity of the resist.

Embodiment 4

Figure 7:
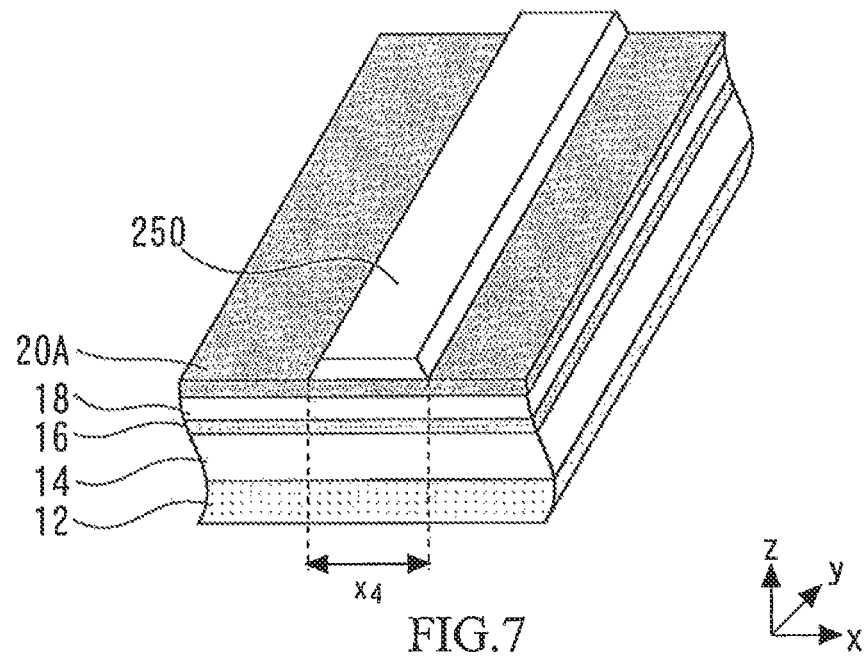
FIG. 7 is a partially sectional perspective view of a wafer for explaining a distributed feedback laser diode fabrication method according to an embodiment 4.

FIG. 7 is a partially sectional perspective view of a wafer for explaining a distributed feedback laser diode fabrication method according to an embodiment 4 of the present invention. First, a diffraction grating layer 20A is formed above the substrate 12. Then, an insulating layer 250 patterned into a strip is formed on the diffraction grating layer 20A. The insulating layer 250 is made of, for example, $SiO_2$. The width (x4) of the insulating layer 250 is, for example, 10 μm.

Figure 8:
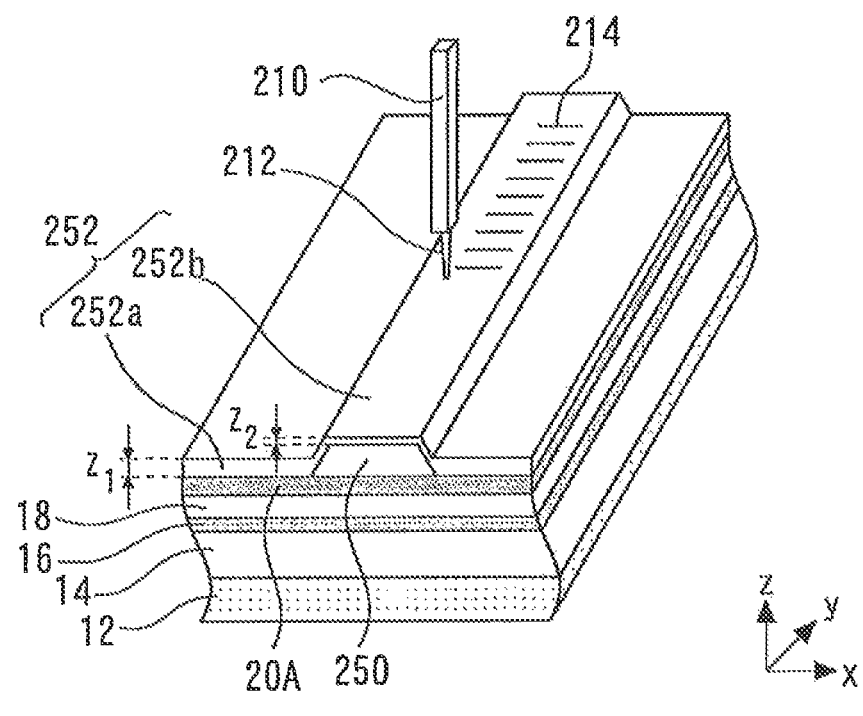
FIG. 8 illustrates the diffraction grating features in the process of being formed.

Subsequently, a resist is formed on the insulating layer 250 and the diffraction grating layer 20A. FIG. 8 illustrates a resist 252. The resist 252 includes a portion (first portion 252a) formed on the diffraction grating layer 20A and a portion (second portion 252b) formed on the insulating layer 250. Further, the thickness (Z2) of the second portion 252b is made thinner than the thickness (Z1) of the first portion 252a by taking advantage of the property of the resist of being less prone to adhere to the surface of the insulating layer 250 than the (100) surface of the diffraction grating layer 20A. It should be noted that the second portion 252b may be made thinner than the first portion 252a in another way.

Subsequently, an electron beam is applied to the resist (second portion 252b) on the insulating layer 250 to draw diffraction grating features by electron beam lithography. Specifically, diffraction grating features 214 are formed using an electron beam 212 emitted from the electron beam irradiation apparatus 210. FIG. 8 illustrates the diffraction grating features in the process of being formed. Then, the insulating layer 250 and the diffraction grating layer 20A are etched by, for example dry etching to leave portions of the diffraction grating layer 20A which are directly under the diffraction grating features 214. Thus, a diffraction grating is formed. After the formation of the diffraction grating, residual portions of the insulating layer 250 are removed.

To increase the speed of electron beam lithography, a thinner resist is preferable. In the embodiment 4 of the present invention, since electron beam lithography is performed on a thin portion (second portion 252b) of the resist 252, the time required for electron beam lithography can be reduced by increasing the speed of electron beam lithography. It should be noted that features of the embodiments described above can be appropriately combined.

According to the present invention, the time required for electron beam lithography can be reduced by reducing the lengths of features constituting a diffraction grating, forming each of the features by large dots, or forming a conductive layer or an insulating layer under a resist.

Obviously many modifications and variations of the present invention are possible in the light of the above teachings. It is therefore to be understood that within the scope of the appended claims the invention may be practiced otherwise than as specifically described.

What is claimed is:

1. A distributed feedback laser diode comprising:
    a substrate;
    an active layer located above and supported by the substrate; and
    a diffraction grating comprising a plurality of spaced-apart features and diffracting light generated in the active layer, wherein
        each of the plurality of features includes a plurality of dots,
        each of the dots has a length of not less than 2.5 μm, and
        each of the dots in a respective feature contacts at least one other dot of the feature.

2. The distributed feedback laser diode according to claim 1, wherein
    the features lie on respective straight lines, and
    the dots of each of the features are contiguous along the respective straight line of the feature.

3. A distributed feedback laser diode comprising:
    a substrate;
    an active layer supported by and spaced from the substrate;
    a diffraction grating comprising a semiconductor material supported by the substrate, with the active layer between the diffraction grating and the substrate, wherein
        the diffraction grating extends in a resonator length direction of the distributed feedback laser diode and diffracts light generated in the active layer,
        the diffraction grating comprises a plurality of spaced-apart features,
        each feature is arranged along a respective row direction
        the respective row directions are transverse to the resonator length direction,
        each feature comprises a plurality of dots, each dot having a generally circular shape when viewed transverse to the substrate and transverse to the resonator length and the row directions,
        the circular shape of each element has a diameter not less than 2.5 μm, and
        each of the dots in a respective feature contacts at least one other dot of the feature.

4. The distributed feedback laser diode according to claim 3, wherein
    the row directions lie on respective straight lines, and
    the dots of each of the features are contiguous along the respective row direction of the feature.

* * * * *